Figure 1:
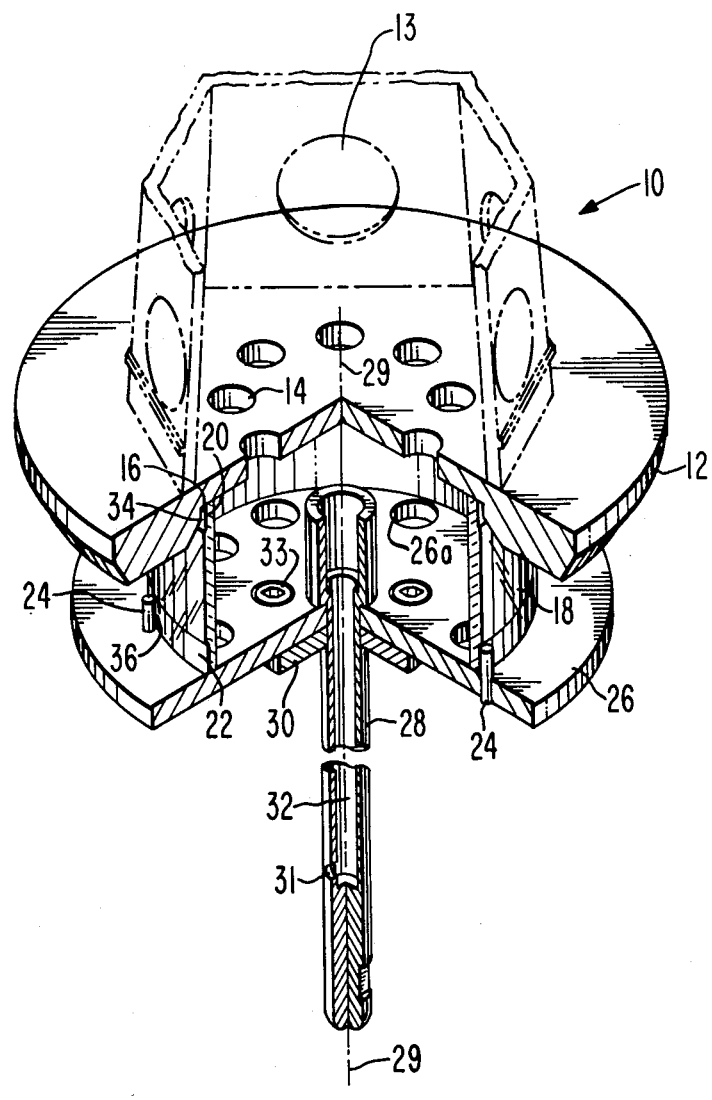

United States Patent [19]

Miller

[11] 4,275,282

[45] Jun. 23, 1981

[54] CENTERING SUPPORT FOR A ROTATABLE WAFER SUPPORT SUSCEPTOR

[75] Inventor: Edward A. Miller, Yardley, Pa.

[73] Assignee: RCA Corporation, New York, N.Y.

[21] Appl. No.: 132,878

[22] Filed: Mar. 24, 1980

[51] Int. Cl.$^3$ .......................... C23C 13/08; H05B 6/10
[52] U.S. Cl. ............................. 219/10.49 R; 118/730;
219/10.67
[58] Field of Search ............... 118/729, 730, 728, 732,
118/724, 725, 715; 219/10.49 R, 10.67, 10.69

[56] References Cited

U.S. PATENT DOCUMENTS

| | | | |
|---|---|---|---|
| 3,696,779 | 10/1972 | Murai et al. | 118/730 X |
| 3,704,987 | 12/1972 | Arndt et al. | 118/730 X |
| 3,745,969 | 7/1973 | Huftman et al. | 118/730 |
| 3,862,397 | 1/1975 | Anderson et al. | 118/730 X |
| 4,062,318 | 12/1977 | Ban et al. | 118/500 X |
| 4,099,041 | 7/1978 | Berkman et al. | 219/10.49 R |

Primary Examiner—Morris Kaplan
Attorney, Agent, or Firm—Birgit E. Morris; D. S. Cohen; Joseph D. Lazar

[57] ABSTRACT

A support mechanism for a rotatable wafer-support susceptor adapted for rotation by a shaft in a vertical orientation. The support mechanism comprises a quartz pedestal tube resting with frictional engagement on a metallic table fixed to the shaft. The pedestal supports, with frictional engagement, the base of the susceptor and is rotated by frictional engagement with the table. Means disposed within an aperture of the base and within the tube constrain the base, and thus the susceptor, and the tube to symmetrical rotation about the shaft passing through a centrally located aperture in the base.

7 Claims, 2 Drawing Figures

CENTERING SUPPORT FOR A ROTATABLE WAFER SUPPORT SUSCEPTOR

This invention relates to epitaxial rotatable reactors and more particularly to the support means for such reactors disposed for rotation in a vertical position.

Epitaxial deposition on wafers on rotatable reactor susceptors are known in the art. See, for example, U.S. Pat. No. 4,099,041 issued to S. Berkman and D. B. Irish on July 4, 1979, for a "Susceptor for Heating Semiconductor Substrates." The structure of such reactor susceptors, also known as "barrel reactors," are formed of hollow polyhedrons rotatably supported in a vertical orientation carrying substrates in a near-vertical orientation on the outer walls. The susceptor, while being rotated in a reaction chamber, is exposed to a gas carrying material for deposition on the surface of the substrate. It is essential that the susceptor be rotated about an axis that is true without any eccentricity of the respective wafers with respect to the axis of rotation.

Another type of reactor in which the substrates are oriented in a horizontal position perpendicular to the axis of rotation of the apparatus is disclosed in U.S. Pat. No. 4,062,318 issued to V. S. Ban and S. L. Gilbert on Dec. 13, 1977, for an "Apparatus for Chemical Vapor Deposition." In this type of reactor, also known as a "rotary reactor," the wafers are rotated about an axis perpendicular to their plane. Any eccentric rotation of the susceptor will cause a non-uniform deposition of the epitaxial film. In practice, such non-uniform layering adversely affects the production yields manifested as rejections in the order of 5-10% of the substrates. Several causes for eccentric rotation of the susceptor are heating and wear effects on the structure supporting the reactor assembly as will be explained in greater detail with reference to FIG. 1.

According to the present invention, a susceptor is rotated in a vertical orientation by a horizontal table affixed to a vertical shaft. The table carries with frictional engagement a cylindrical tube which, in turn, supports with frictional engagement the base of the susceptor. The base and thus the susceptor are constrained to symmetrical rotation by the shaft passing through a centrally located aperture in the base.

Figure 2:
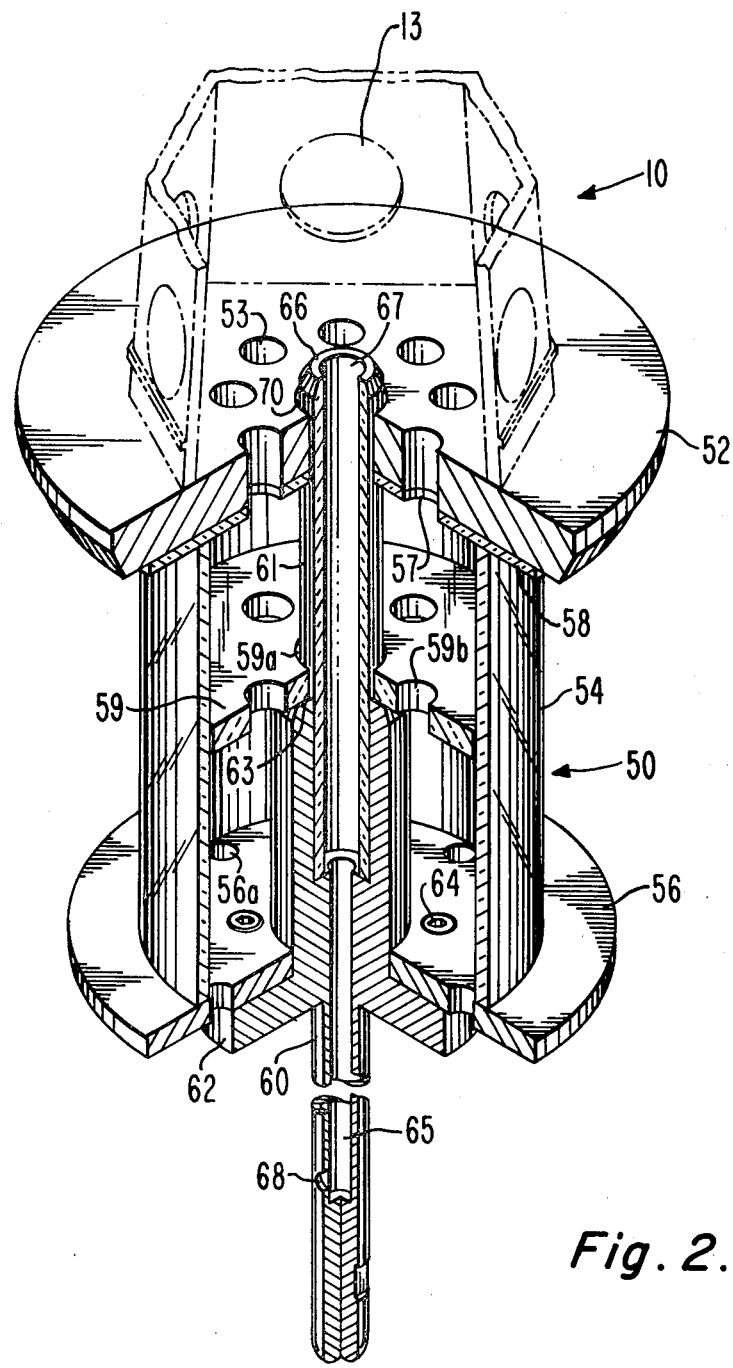

In the drawing:

FIG. 1 is a partial, cross-sectional view in perspective of a barrel type reactor of the prior art; and FIG. 2 is a partial, cross-sectional view also in perspective of a reactor provided with the support mechanism according to the present invention.

As shown in FIG. 1, a barrel reactor 10 of the type described in the above-mentioned U.S. Pat. No. 4,009,041 is supported on a base 12 having a plurality of passageways 14 through the base 12 and a central recess 16 in the bottom surface of the base. The susceptor 10 is suitably formed of carbon coated graphite, while the base 12 is formed of carbon, although graphite coated with carbon may also be used. A cylindrical pedestal tube 18 supports base 12 with frictional engagement within the base recess 16. Tube 18 is formed of electrically insulating material such as quartz and is machined with an annular recess 20 in the upper portion and an annular recess 22 in the lower portion. The upper recess 20 is machined to a diametrical dimension that will fit snugly within the recess 16. The lower recess 22 snugly fits within three steel vertical pins 24 rigidly mounted to a metal table 26 formed of a suitable alloy such as Inconel. Table 26 is provided with purge holes 26a. Table 26 is fixed to a shaft 28 provided with a collar 30 suitably attached to table 26 as by screws 33. Shaft 28 is hollow having an access aperture 31 for communication with the passageway 32. Aperture 31 is used to receive flush gas, such as nitrogen, to purge the chamber containing susceptor 10 prior to the reaction process.

In operation, as the shaft 28 is rotated by a suitable means (not shown), the susceptor 10 is rotated about the axis 29 of shaft 28 at a relatively slow rate for, for example, 5 r.p.m., by the frictional engagement of table 26 with tube 18 and of tube 18 with the base 12. However, the metal-quartz interfaces of table 26, and pins 24 with tube 18 in the environment of high heat within the reaction chamber, typically in the order of 800°-1200° F., frequently cause eccentric rotation of the structure. The eccentric rotation results from radial slippage or sliding of the tube 18 on the surface of the table 26 during rotation of the susceptor 10 as the spacing 36 between pins 24 and the tube recess 22 enlarges due to non-uniform thermal expansion of the quartz tube and metal pins. Accordingly, even in the initial phases of the use of the apparatus of the support structure shown in FIG. 1, where wear is not a factor, thermally-caused misalignments of the various parts result in the reactor to rotate about the axis 29 of shaft 28 eccentrically. As a consequence, non-uniform epitaxial layers may be deposited on the wafer 13.

Moreover, with extended use of the apparatus, the quartz material of the pedestal tube 18 rubbing against the carbon material of base 12 causes erosion of the carbon material of the base 12 thereby enlarging the space 34 between the quartz tube recess 20 and the vertical wall of recess 16. As the space 34 enlarges, misalignment of the tube 18 with the wall of recess 16 also results in eccentric rotation of the susceptor 10 which, in turn, aggravates the above-described non-uniform deposition of epitaxial material on the wafers 13.

Refer now to FIG. 2 in which the reactor 10 is provided with a base 52 that is similar to base 12 of FIG. 1 but without a recess. Passageways 53 (similar to passageways 14 of base 12, FIG. 1) allow for exhaust of purging gas. Base 52 is suitably formed of carbon or carbon coated graphite. The support mechanism of the invention generally indicated by reference number 50 includes the base 52 resting on a cylindrical pedestal tube 54 whose lower end rests on a metal table 56 preferably formed of Inconel alloy. Tube 54 is suitably formed of quartz. To minimize wear on base 52, preferably a quartz disc 58 is provided and positioned between the bottom surface of base 52 and the upper end of tube 54. Disc 58 is provided with apertures 57 which are preferably, but not necessarily, in register with apertures 53 of base 52 to allow for the passage of purging gas from the interior of reactor 10. A retaining quartz disc 59 with center aperture 59a and purge apertures 59b is positioned within the tube 54 and rests on the shoulder 63 of shaft 60. Alternatively, disc 59 may be positioned on the surface of table 56 within tube 54. In either location the aperture 59a is large enough to allow for free rotation about shaft 60 or 61. Table 56 provided with purge holes 56a is attached to a shaft 60 driven by a motor (not shown) at a speed of about 5 r.p.m. A collar 62 is attached to table 56 as by screws 64.

A shaft extension 61 is joined within shaft 60 in telescopic relation within shoulder 63 of shaft 60. The fit of shaft 61 into the end of shaft 60 is snug to maintain axial alignment but without necessarily being so tight as to rotate shaft 61 as shaft 60 rotates. Shaft 61, is made of quartz, so that it will not contaminate the reaction gases in the portion of the chamber containing the susceptor 10. Thus, the susceptor is isolated by the quartz members 58, 54 and 59 from the steel metallic members 56 and 62 and steel shaft 60.

For purging the interior of the reactor 10 prior to the deposition process, shaft 60 is provided with passageway 65 which registers with passageway 67 in shaft 61 ending with an exit nozzle 66 within the chamber of susceptor 10. An aperture 68 is provided at the lower portion of shaft 60 for connection to a suitable flushing gas such as nitrogen.

In operation, shaft 60 is rotated to rotate pedestal 54 by frictional engagement of the lower end of the pedestal with the upper surface of the table 56. Frictional contact between the upper edge of tube 54 and plate 58 effects rotation of base member 52 by frictional contact with the lower surface of base member 52. As base member 52 rotates, susceptor 10 is rotated about shaft extension 61. Aperture 70 in the base 52 is as large as necessary to provide a snug fit with shaft 61. Since the temperature coefficient of the shaft 61, being made of quartz, is substantially the same as the temperature coefficient of the base 52, thermal effects are a minimal. Furthermore, since the surface contact of the base 52 with the member 58 or, directly with the upper end of tube 54 if member 58 is not used, is relatively large, there is a minimum of wear on the base 52. Heretofore, the base 12 of prior art susceptors such as shown in FIG. 1, exhibit excessive wear resulting in many costly replacements. It should be understood that the cost of fabricating a prior art base member 12 with its recess 16 is high. Moreover, providing recesses 20 and 22 in the prior art tube 18 is costly.

Tube 54 is constrained from lateral, or radial displacement relative to the shaft extension 61 or shaft 60 by the retaining disc 59. The dimensions of the disc 59 are not critical since it serves merely to limit the amount of a displacement that the pedestal may incur relative to the plate 58 and table 56. This support mechanism is not critically dependent on maintaining axial alignment of pedestal 54 as was required in the prior art structure of FIG. 1.

The support mechanism 50 has operated in reaction systems resulting in a significant increase in wafer yield than otherwise would have been reduced by eccentric rotation of the susceptor. The support mechanism 50 of the invention is not subject to temperature variations or to wear and thereby provides for positive centering of the susceptor 10.

What is claimed is:

1. In a susceptor of the type adapted to support one or more substrates within a reaction chamber, the susceptor being disposed for rotation in a vertical position wherein the improvement comprises:
    a rotatable vertical shaft;
    a horizontal flat member affixed perpendicularly to the shaft;
    a cylindrical tube positioned about said shaft and supported on its lower edge with frictional engagement on the surface of said flat member;
    a base member affixed to the bottom of said susceptor and adapted to support with frictional engagement said susceptor in a vertical orientation, said base member having a central aperture and having a bottom flat surface for support on the upper edge of said tube, the respective upper and lower edges of said tube being in frictional relationship with the surfaces of said base member and said flat member contiguous with said upper and lower tube edges;
    an apertured disc disposed within said tube and operatively associated with said shaft and adapted to restrain radial movement of said tube relative to the shaft; and
    means extending from said rotatable shaft to pass through said base member aperture for maintaining the position of said base member in fixed axial and symmetrical relation with said rotatable shaft.

2. In the susceptor of claim 1 wherein said flat member and said rotatable shaft are metallic and said cylindrical tube and said shaft extension means are quartz.

3. In the susceptor of claim 1 wherein said shaft extension means is a shaft in telescopic relation with said rotatable shaft, the shaft extension diameter providing a snug fit with the base member aperture to maintain the symmetrical position of said base member.

4. In a susceptor as recited in claim 1 including a second disc positioned with frictional engagement between said tube and said base member and having an aperture for receiving said shaft, the base member supported by said second disc, and said second disc supported by said tube, said base being formed of susceptor material and said tube and second disc being formed of quartz.

5. In a susceptor as recited in claim 1 wherein said second disc is positioned about said rotatable shaft.

6. In a susceptor as recited in claim 3 wherein said second disc is positioned about said shaft extension.

7. In a suseceptor of the type recited in claim 1 wherein said rotatable shaft is hollow and said extension means is a hollow tube extending into said susceptor for carrying purging gas from said rotatable shaft.

* * * * *